(12) United States Patent
Ishikawa et al.

(10) Patent No.: US 10,815,586 B2
(45) Date of Patent: Oct. 27, 2020

(54) GALLIUM-ARSENIDE-BASED COMPOUND SEMICONDUCTOR CRYSTAL AND WAFER GROUP

(71) Applicant: Sumitomo Electric Industries, Ltd., Osaka-shi, Osaka (JP)

(72) Inventors: Yukio Ishikawa, Osaka (JP); Hidetoshi Takayama, Osaka (JP); Hirokazu Oota, Osaka (JP); Shuuichi Kaneko, Osaka (JP)

(73) Assignee: SUMITOMO ELECTRIC INDUSTRIES, LTD., Osaka-shi, Osaka (JP)

(*) Notice: Subject to any disclaimer, the term of this patent is extended or adjusted under 35 U.S.C. 154(b) by 0 days.

(21) Appl. No.: 16/473,710

(22) PCT Filed: Sep. 14, 2017

(86) PCT No.: PCT/JP2017/033309
§ 371 (c)(1),
(2) Date: Jun. 26, 2019

(87) PCT Pub. No.: WO2019/053856
PCT Pub. Date: Mar. 21, 2019

(65) Prior Publication Data
US 2019/0352800 A1 Nov. 21, 2019

(51) Int. Cl.
*H01L 29/36* (2006.01)
*C30B 29/42* (2006.01)
(Continued)

(52) U.S. Cl.
CPC .............. *C30B 29/42* (2013.01); *C30B 11/04* (2013.01); *H01L 29/20* (2013.01); *H01L 29/34* (2013.01); *H01L 29/36* (2013.01)

(58) Field of Classification Search
None
See application file for complete search history.

(56) References Cited

U.S. PATENT DOCUMENTS

| 5,612,014 A | * | 3/1997 | Inoue .................... C30B 11/00 117/2 |
| 6,254,677 B1 | | 7/2001 | Hashio |
| 2015/0137247 A1 | * | 5/2015 | Chen ............... H01L 21/823892 257/351 |

FOREIGN PATENT DOCUMENTS

| EP | 0990717 A1 | 4/2000 |
| JP | H05-105585 A | 4/1993 |

(Continued)

OTHER PUBLICATIONS

Eichler, et al.,"A combined carbon and oxygen segregation model for the LEC growth of SI GaAs," Journal of Crystal Growth, vol. 247 (2003) pp. 69-76.

(Continued)

Primary Examiner — Dung A. Le
(74) Attorney, Agent, or Firm — Faegre Drinker Biddle & Reath LLP

(57) ABSTRACT

A GaAs-based compound semiconductor crystal includes a straight body portion having a cylindrical shape, wherein the straight body portion has a diameter of more than or equal to 110 mm and has a length of more than or equal to 100 mm and less than or equal to 400 mm, and the straight body portion has a first end surface and a second end surface having a higher specific resistance than a specific resistance of the first end surface, and a ratio $R_{20}/R_{10}$ of a specific resistance $R_{20}$ at the second end surface side to a specific resistance $R_{10}$ at the first end surface side is more than or equal to 1 and less than or equal to 2.

8 Claims, 1 Drawing Sheet

(51) Int. Cl.
*C30B 11/04* (2006.01)
*H01L 29/20* (2006.01)
*H01L 29/34* (2006.01)

(56) References Cited

FOREIGN PATENT DOCUMENTS

| | | |
|---|---|---|
| JP | H10-36197 A | 2/1998 |
| JP | H11-12086 A | 1/1999 |
| JP | H11-335194 A | 12/1999 |
| JP | 2001-89300 A | 4/2001 |
| JP | 2004-107099 A | 4/2004 |
| JP | 2013-95634 A | 5/2013 |
| WO | WO-99/27164 A1 | 6/1999 |

OTHER PUBLICATIONS

Emori, et al., "Effect of Water Content of B2O3 Encapsulant on Semi-Insulating LEC GaAs Crystal," Japanese Journal of Applied Physics, vol. 24, No. 5, May 1985, pp. L291-L293.

* cited by examiner

GALLIUM-ARSENIDE-BASED COMPOUND SEMICONDUCTOR CRYSTAL AND WAFER GROUP

TECHNICAL FIELD

The present invention relates to a gallium-arsenide-based compound semiconductor crystal and a wafer group.

BACKGROUND ART

In order to provide desired electrical conductivity/insulating property to a gallium-arsenide-based compound semiconductor crystal, a method of adding a predetermined impurity has been proposed.

For example, WO 99/27164 (Patent Literature 1) discloses a vertical boat growth method of single crystal, semi-insulating GaAs ingots, the method including: (a) loading a crucible with a charge of poly-crystal GaAs material and a source of carbon over a selectively oriented seed crystal; (b) placing the crucible in a closed quartz tube; and (c) applying a controlled pattern of heating to melt the charge and a portion of the seed crystal to sequentially freeze the melt starting at the interface with the seed crystal to form a single crystal, characterized in that the source of carbon is graphite powder, and the pattern of heating includes heating the charge to the melting point temperature of GaAs, holding that temperature for a period of time to promote dissolution of the graphite powder in the GaAs melt, and thereafter controlling the pattern of heating to sequentially freeze the melt to form the single crystal.

Moreover, Japanese Patent Laying-Open No. 11-012086 (Patent Literature 2) discloses a method for manufacturing a compound semiconductor single crystal (for example, a GaAs single crystal) through a LEC (Liquid Encapsulated Czochralski) method, wherein as a source material for addition of a carbon impurity to the compound semiconductor single crystal, a simple substance carbon or a polycrystal of compound semiconductor doped with a high concentration of carbon is used.

Moreover, Japanese Patent Laying-Open No. 2004-107099 (Patent Literature 3) discloses a method for manufacturing a semi-insulating GaAs single crystal by placing a GaAs (gallium arsenide) source material in a crucible having a bottom portion on which a seed crystal is disposed, then heating the crucible to form the source material into a melt, and growing a semi-insulating GaAs single crystal from the seed crystal upward in a vertical direction by cooling the melt, wherein the semi insulating GaAs single crystal is grown with a solid carbon being added to the source material in an inert gas atmosphere including carbon monoxide or carbon dioxide.

CITATION LIST

Patent Literature

PTL 1: WO 99/27164
PTL 2: Japanese Patent Laying-Open No. 11-012086
PTL 3: Japanese Patent Laying-Open No. 2004-107099

SUMMARY OF INVENTION

A gallium-arsenide-based compound semiconductor crystal according to a certain aspect of the present invention includes a straight body portion having a cylindrical shape, wherein the straight body portion has a diameter of more than or equal to 110 mm and has a length of more than or equal to 100 mm and less than or equal to 400 mm, and the straight body portion has a first end surface and a second end surface having a higher specific resistance than a specific resistance of the first end surface, and a ratio $R_{20}/R_{10}$ of a specific resistance $R_{20}$ at the second end surface side to a specific resistance $R_{10}$ at the first end surface side is more than or equal to 1 and less than or equal to 2.

A wafer group according to another aspect of the present invention includes a plurality of wafers each formed from a straight body portion of a gallium-arsenide-based compound semiconductor crystal, the straight body portion having a cylindrical shape, each of the plurality of wafers having a diameter of more than or equal to 110 mm and a thickness of more than or equal to 500 μm and less than or equal to 800 μm, wherein the wafer group includes a first wafer having a lowest specific resistance and a second wafer having a highest specific resistance, and a ratio $R_2/R_1$ of a specific resistance $R_2$ in the second wafer to a specific resistance $R_1$ in the first wafer is more than or equal to 1 and less than or equal to 2.

DETAILED DESCRIPTION

Figure 1:
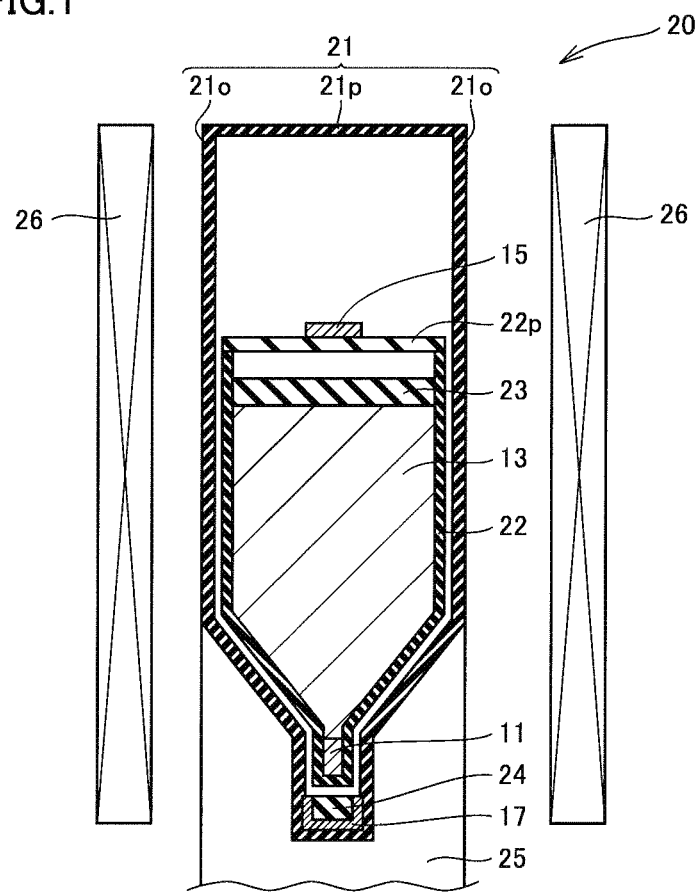
FIG. 1 is a schematic cross sectional view showing method and apparatus for manufacturing a gallium-arsenide-based compound semiconductor crystal according to the present embodiment.

Problems to be Solved by the Present Disclosure

In the method disclosed in WO 99/27164 (Patent Literature 1), the solid carbon is added to the GaAs single crystal within the closed container. Hence, carbon is incorporated into the GaAs melt from the solid carbon also during the growth of the GaAs single crystal, with the result that it is difficult to control a specific resistance in the longitudinal direction (crystal growth direction) of the GaAs single crystal, disadvantageously.

In each of the method for manufacturing the compound semiconductor single crystal as disclosed in Japanese Patent Laying-Open No. 11-012086 (Patent Literature 2) and the method for manufacturing the semi-insulating GaAs single crystal as disclosed in Japanese Patent Laying-Open No. 2004-107099 (Patent Literature 3), a pressure container is used instead of a sealed container, so that the specific resistance of the single crystal in the longitudinal direction is controlled by additionally supplying a carbon-containing gas during the single crystal growth. Hence, these methods are not applicable to a method for manufacturing a compound semiconductor crystal using a sealed container to which a carbon-containing gas cannot be additionally supplied during single crystal growth, disadvantageously.

In view of the above, in order to solve the above-described problem, the present disclosure has an object to provide: a long gallium-arsenide-based compound semiconductor crystal which is large in the length (thickness) direction (crystal growth direction) of the crystal and in which a specific resistance is controlled in the length (thickness) direction of the crystal; and a wafer group obtained therefrom.

Advantageous Effect of the Present Disclosure

According to the present disclosure, there can be provided: a long gallium-arsenide-based compound semiconductor crystal which is large in the length (thickness) direction (crystal growth direction) of the crystal and in which a specific resistance is controlled in the length (thickness) direction of the crystal; and a wafer group obtained therefrom.

DESCRIPTION OF EMBODIMENTS

First, embodiments of the present invention are listed and described.

[1] A gallium-arsenide-based compound semiconductor crystal according to a certain aspect of the present invention includes a straight body portion having a cylindrical shape, wherein the straight body portion has a diameter of more than or equal to 110 mm and has a length of more than or equal to 100 mm and less than or equal to 400 mm, and the straight body portion has a first end surface and a second end surface having a higher specific resistance than a specific resistance of the first end surface, and a ratio $R_{20}/R_{10}$ of a specific resistance $R_{20}$ at the second end surface side to a specific resistance $R_{10}$ at the first end surface side is more than or equal to 1 and less than or equal to 2. Since the gallium-arsenide-based compound semiconductor crystal of the present embodiment has the large straight body portion in which variation in specific resistance is small, a plurality of wafers among which variation in specific resistance is small are obtained therefrom.

[2] In the gallium-arsenide-based compound semiconductor crystal, a ratio $C_{20}/C_{10}$ of a carbon concentration $C_{20}$ at the second end surface side to a carbon concentration $C_{10}$ at the first end surface side can be more than or equal to 1 and less than or equal to 2. Such a gallium-arsenide-based compound semiconductor crystal is suitable for attaining small variation in specific resistance.

[3] In the gallium-arsenide-based compound semiconductor crystal, a ratio $B_{20}/B_{10}$ of a boron concentration $B_{20}$ at the second end surface side to a boron concentration $B_{10}$ at the first end surface side can be more than or equal to 1 and less than or equal to 2. Such a gallium-arsenide-based compound semiconductor crystal is suitable for attaining small variation in crystal quality.

[4] In the gallium-arsenide-based compound semiconductor crystal, a ratio $E_{20}/E_{10}$ of an etching pit density $E_{20}$ at the second end surface side to an etching pit density $E_{10}$ at the first end surface side can be more than or equal to 0.8 and less than or equal to 1.2. In such a gallium-arsenide-based compound semiconductor crystal, variation in crystal quality is small.

[5] A wafer group according to another aspect of the present invention includes a plurality of wafers each formed from a straight body portion of a gallium-arsenide-based compound semiconductor crystal, the straight body portion having a cylindrical shape, each of the plurality of wafers having a diameter of more than or equal to 110 mm and a thickness of more than or equal to 500 μm and less than or equal to 800 μm, wherein the wafer group includes a first wafer having a lowest specific resistance and a second wafer having a highest specific resistance, and a ratio $R_2/R_1$ of a specific resistance $R_2$ in the second wafer to a specific resistance $R_1$ in the first wafer is more than or equal to 1 and less than or equal to 2. In the wafer group of the present embodiment, variation in specific resistance among the wafers is small.

[6] In the wafer group, a ratio $C_2/C_1$ of a carbon concentration $C_2$ in the second wafer to a carbon concentration $C_1$ in the first wafer can be more than or equal to 1 and less than or equal to 2. Such a wafer group is suitable for attaining small variation in specific resistance among the wafers.

[7] In the wafer group, a ratio $B_2/B_1$ of a boron concentration $B_2$ in the second wafer to a boron concentration $B_1$ in the first wafer can be more than or equal to 1 and less than or equal to 2. Such a wafer group is suitable for attaining small variation in crystal quality among the wafers.

[8] In the wafer group, a ratio $E_2/E_1$ of an etching pit density $E_2$ in the second wafer to an etching pit density $E_1$ in the first wafer can be more than or equal to 0.8 and less than or equal to 1.2. In such a wafer group, the variation in crystal quality among the wafers is small.

DETAILS OF EMBODIMENTS OF THE PRESENT INVENTION

First Embodiment: Gallium-Arsenide-Based Compound Semiconductor Crystal

A GaAs (gallium arsenide)-based compound semiconductor crystal according to the present embodiment includes a straight body portion having a cylindrical shape, wherein the straight body portion has a diameter of more than or equal to 110 mm and has a length of more than or equal to 100 mm and less than or equal to 400 mm, and the straight body portion has a first end surface and a second end surface having a higher specific resistance than a specific resistance of the first end surface, and a ratio $R_{20}/R_{10}$ of a specific resistance $R_{20}$ at the second end surface side to a specific resistance $R_{10}$ at the first end surface side is more than or equal to 1 and less than or equal to 2. Since the GaAs-based compound semiconductor crystal of the present embodiment has the large straight body portion in which variation in specific resistance is small, a plurality of wafers among which variation in specific resistance is small are obtained therefrom.

(Gallium-Arsenide-Based Compound Semiconductor Crystal)

The GaAs (gallium arsenide)-based compound semiconductor crystal refers to a compound semiconductor crystal including: Ga (gallium) as a group 13 element; and As (arsenic) as a group 15 element. Specific examples thereof include a GaAs crystal, an $Al_{1-x}Ga_xAs$ crystal (0<x<1), a $GaAs_yP_{1-y}$ crystal (0<y<1), an $In_{1-x}Ga_xAs_yP_{1-y}$ crystal (0<x<1 and 0<y<1), and the like.

(Size of Straight Body Portion of Gallium-Arsenide-Based Compound Semiconductor Crystal)

The GaAs (gallium arsenide)-based compound semiconductor crystal include the straight body portion having a cylindrical shape, and the straight body portion has a diameter of more than or equal to 110 mm and a length of more than or equal to 100 mm and less than or equal to 400 mm. That is, the straight body portion has a large volume of more than or equal to 949850 mm$^3$. In order to obtain a large effect of reducing variation in specific resistance, the diameter of the straight body portion is more than or equal to 110 mm, is preferably more than or equal to 128 mm, and is more preferably more than or equal to 150 mm, and is preferably less than or equal to 200 mm and is more preferably less than or equal to 154 mm. Here, the length of the straight body portion is a length in the crystal growth direction. As the length of the straight body portion is larger in the range of 100 mm to 400 mm, the variation in specific resistance is larger. When the length is less than 100 mm, the variation in specific resistance is small. When the length is more than 400 mm, it is difficult to reduce the variation in specific resistance. In view of the above, the length of the straight body portion is more than or equal to 100 mm, is preferably more than or equal to 200 mm, and is more preferably more than or equal to 250 mm, and is less than or equal to 400 mm, is preferably less than or equal to 380 mm, and is more preferably less than or equal to 350 mm.

(Specific Resistance of Straight Body Portion of Gallium-Arsenide-Based Compound Semiconductor Crystal)

In the GaAs (gallium arsenide)-based compound semiconductor crystal, the straight body portion has the first end surface and the second end surface having a higher specific resistance than the specific resistance of the first end surface, and ratio $R_{20}/R_{10}$ of specific resistance $R_{20}$ at the second end surface side to the specific resistance $R_{10}$ at the first end surface side is more than or equal to 1 and less than or equal to 2. That is, in the GaAs-based compound semiconductor crystal, the specific resistance becomes larger in the direction from the first end portion to the second end portion of the straight body portion; however, even though the diameter and length of the straight body portion are large, particularly, even though the length of the straight body portion is large, the variation in specific resistance is small. In view of this, ratio $R_{20}/R_{10}$ is more than or equal to 1 and less than or equal to 2, is preferably more than or equal to 1 and less than or equal to 1.8, and is more preferably more than or equal to 1 and less than or equal to 1.5. Here, the specific resistance is measured in accordance with the van der Pauw method using ResiTest8300 provided by TOYO Corporation.

(Carbon Concentration of Straight Body Portion of Gallium-Arsenide-Based Compound Semiconductor Crystal)

In order to attain small variation in specific resistance, in the GaAs (gallium arsenide)-based compound semiconductor crystal, ratio $C_{20}/C_{10}$ of carbon concentration $C_{20}$ at the second end surface side to carbon concentration $C_{10}$ at the first end surface side is preferably more than or equal to 1 and less than or equal to 2, is more preferably more than or equal to 1 and less than or equal to 1.5, and is further preferably more than or equal to 1 and less than or equal to 1.2. Here, the carbon concentration is measured in accordance with a FTIR (Fourier Transform Infrared Spectroscopy) method (specifically, observation of an absorption peak of local oscillation mode at 582 cm$^{-1}$).

(Boron Concentration of Straight Body Portion of Gallium-Arsenide-Based Compound Semiconductor Crystal)

In the GaAs (gallium arsenide)-based compound semiconductor crystal, in order to attain small variation in crystal quality, ratio $B_{20}/B_{10}$ of boron concentration $B_{20}$ at the second end surface side to boron concentration $B_{10}$ at the first end surface side is preferably more than or equal to 1 and less than or equal to 2, is more preferably more than or equal to 1 and less than or equal to 1.5, and is further preferably more than or equal to 1 and less than or equal to 1.3. Here, the boron concentration is measured in accordance with a GDMS (Glow Discharge Mass Spectrometry) method (VG9000 system provided by VG Elemental).

(Etching Pit Density of Straight Body Portion of Gallium-Arsenide-Based Compound Semiconductor Crystal)

In the GaAs (gallium arsenide)-based compound semiconductor crystal, in order to attain small variation in crystal quality, ratio $E_{20}/E_{10}$ of etching pit density $E_{20}$ at the second end surface side to etching pit density $E_{10}$ at the first end surface side is preferably more than or equal to 0.8 and less than or equal to 1.3, is more preferably more than or equal to 0.85 and less than or equal to 1.25, and is further preferably more than or equal to 0.9 and less than or equal to 1.2. Here, the EPD (etching pit density) refers to the number of etching pits per unit area, the etching pits being generated in a surface of the crystal when treated with a chemical. Specifically, the EPD of the GaAs-based compound semiconductor crystal refers to the number of etching pits per unit area, the etching pits being generated in the surface when treated with a melt of potassium hydroxide (KOH) having a purity of more than or equal to 85 mass % at 500° C. for 20 minutes. The EPD is measured using a differential interference microscope.

(Manufacturing Apparatus for Gallium-Arsenide-Based Compound Semiconductor Crystal)

With reference to FIG. 1, a manufacturing apparatus 20 for the GaAs (gallium arsenide)-based compound semiconductor crystal in the present embodiment preferably has a sealed container 21 because such a manufacturing apparatus is inexpensive. Specifically, manufacturing apparatus 20 for the GaAs-based compound semiconductor crystal preferably includes: sealed container 21; a crucible 22 and a gas-permeable crucible cover 22p each disposed in sealed container 21; a holder 25 for holding sealed container 21; and a heater 26 disposed around the outer periphery of sealed container 21.

Sealed container 21 has a shape corresponding to crucible 22 described below. Sealed container 21 includes: a seed crystal corresponding portion corresponding to a seed crystal holding portion of crucible 22; and a crystal growth corresponding portion corresponding to a crystal growth portion of crucible 22. The seed crystal corresponding portion is a hollow cylindrical portion that opens at a side connected to the crystal growth corresponding portion and that is provided with a bottom wall at a side opposite thereto. The crystal growth corresponding portion includes: a conical portion having a conical shape and connected to the seed crystal corresponding portion at the small-diameter side in the axial direction; and a hollow cylindrical straight body portion connected to the large-diameter side of the conical portion in the axial direction. The seed crystal corresponding portion of sealed container 21 has a function of holding a lower solid carbon 17 and a sealing member 24 in the seed crystal corresponding portion. The material of sealed container 21 is not particularly limited as long as the material has a high mechanical strength and can withstand a temperature at which a source material is melted. The material of sealed container 21 is preferably a transparent quartz having a OH (hydroxyl) group concentration of less than or equal to 200 ppm or the like because the transparent quartz is of low cost and high purity.

Crucible 22 includes the seed crystal holding portion and the crystal growth portion connected onto the seed crystal holding portion. The seed crystal holding portion is a hollow cylindrical portion that opens at a side connected to the crystal growth portion and that is provided with a bottom wall at a side opposite thereto. At this portion, a seed crystal 11 for the GaAs-based compound semiconductor crystal can be held. The crystal growth portion includes: a conical portion having a conical shape and connected to the seed crystal holding portion at the small-diameter side in the axial direction; and a hollow cylindrical straight body portion connected to the large-diameter side of the conical portion in the axial direction. The crystal growth portion has a function of: holding a GaAs-based compound semiconductor source material 13 and a sealing member 23 disposed thereon in the crystal growth portion; and growing the GaAs-based compound semiconductor crystal by solidifying GaAs-based compound semiconductor source material 13 having been heated into a molten state. The material of crucible 22 is not particularly limited as long as the material has a high mechanical strength and can withstand the temperature at which the source material is melted. For the material of crucible 22, PBN (pyrolytic boron nitride) or the like is preferable because PBN is of high purity and hardly reacts with the melt of the source material.

Gas-permeable crucible cover 22p has a function of holding upper solid carbon 15 and permitting passage of carbon oxide gas, which is generated from upper solid carbon 15 and lower solid carbon 17 by heating during the growth of the GaAs-based compound semiconductor crystal, so as to supply carbon to GaAs-based compound semiconductor source material 13. The shape and structure of gas-permeable crucible cover 22p are not particularly limited as long as the above function is attained. The material of gas-permeable crucible cover 22p is not particularly limited as long as the material has a high mechanical strength and can withstand the temperature at which the source material is melted. For the material of gas-permeable crucible cover 22p, high-purity carbon, PBN (pyrolytic boron nitride) with permeable pores, porous alumina, or the like is preferable because they are of high purity and hardly react with the sealing member.

The material of each of sealing members 23, 24 is not particularly limited as long as the material can withstand the temperature at which the source material is melted, can prevent evaporation loss of a composition element (for example, As) having a high vapor pressure, and has a function of permitting passage of the carbon oxide gas during the growth of the GaAs-based compound semiconductor crystal so as to supply carbon to GaAs-based compound semiconductor source material 13. For the material of each of sealing members 23, 24, a boron oxide such as $B_2O_3$ is preferable.

Holder 25 is not particularly limited as long as sealed container 21 can be held and the growth of the GaAs-based compound semiconductor crystal by melting and solidification of GaAs-based compound semiconductor source material 13 can be appropriately controlled by moving sealed container 21 as required. Moreover, heater 26 is not particularly limited as long as the growth of the GaAs-based compound semiconductor crystal by melting and solidification of GaAs-based compound semiconductor source material 13 can be appropriately controlled.

(Method for Manufacturing Gallium-Arsenide-Based Compound Semiconductor Crystal)

With reference to FIG. 1, in order to efficiently manufacture, at low cost using an inexpensive manufacturing apparatus including a sealed container, a GaAs-based compound semiconductor crystal having a large straight body portion and having small variation in specific resistance, a method for manufacturing a GaAs (gallium arsenide)-based compound semiconductor crystal in the present embodiment is a method for manufacturing a GaAs-based compound semiconductor crystal in accordance with a vertical boat method involving a sealed container, the method including the steps of: placing, in the sealed container, a seed crystal and a GaAs-based compound semiconductor source material, a lower solid carbon located below the GaAs-based compound semiconductor source material, and an upper solid carbon located above the GaAs-based compound semiconductor source material; and growing the GaAs-based compound semiconductor crystal by melting the GaAs-based compound semiconductor source material and solidifying the GaAs-based compound semiconductor source material from the seed crystal side thereof. Specifically, the VB (vertical boat) method or the like with the use of manufacturing apparatus 20 including sealed container 21 is preferable. Specifically, the method for manufacturing the GaAs-based compound semiconductor crystal in the present embodiment preferably includes a lower solid carbon loading step, a seed crystal loading step, a GaAs-based compound semiconductor source material loading step, an upper solid carbon loading step, and a crystal growth step.

First, in the lower solid carbon loading step, using manufacturing apparatus 20 shown in FIG. 1, a solid carbon in the form of an open container is placed as lower solid carbon 17 on the bottom portion of the seed crystal corresponding portion of an unsealed container 21o, and sealing member 24 is placed in lower solid carbon 17. Lower solid carbon 17 is not particularly limited as long as carbon oxide gas is generated by heating. Lower solid carbon 17 is preferably high-purity graphite having been subjected to a purification process with halogen gas or the like because the graphite is of high purity.

Next, in the seed crystal loading step, crucible 22 is placed in unsealed container 21o and seed crystal 11 is placed in the seed crystal holding portion of crucible 22. Seed crystal 11 is not particularly limited as long as a desired GaAs-based compound semiconductor crystal can be grown. In order to grow a GaAs-based compound semiconductor crystal having high crystal quality, seed crystal 11 preferably has the same chemical composition as that of GaAs-based compound semiconductor source material 13 to be loaded in the next step. For example, a GaAs seed crystal is preferable when a GaAs source material is used to grow a GaAs crystal.

Next, in the GaAs-based compound semiconductor source material loading step, GaAs-based compound semiconductor source material 13 are placed in the crystal growth portion of crucible 22 on seed crystal 11 disposed in the seed crystal holding portion of crucible 22. For GaAs-based compound semiconductor source material 13, a GaAs-based compound semiconductor source material having the same chemical composition as that of the GaAs-based compound semiconductor crystal to be grown is suitable. For example, a GaAs source material is suitable to grow a GaAs crystal. Next, sealing member 23 is placed on GaAs-based compound semiconductor source material 13.

Next, in the upper solid carbon loading step, gas-permeable crucible cover 22p is used to place upper solid carbon 15 above sealing member 23 disposed in crucible 22. A manner of placing upper solid carbon 15 is not particularly limited. Upper solid carbon 15 may be engaged with the upper side of gas-permeable crucible cover 22p as shown in FIG. 1. Alternatively, upper solid carbon 15 may be engaged with the lower side of gas-permeable crucible cover 22p (not shown). Next, unsealed container 21o is sealed by a sealing cover 21p, thus obtaining sealed container 21.

Next, in the crystal growth step, sealed container 21 having crucible 22 sealed therein is placed in manufacturing apparatus 20. Here, sealed container 21 is held by holder 25, and heater 26 is disposed to surround sealed container 21. Next, by performing heating using heater 26, GaAs-based compound semiconductor source material 13 and sealing members 23, 24 are melted. Next, by moving sealed container 21 axially downward relative to heater 26 in the heating state, a temperature gradient is formed in the axial direction of crucible 22 such that a temperature at the GaAs-based compound semiconductor source material 13 side is relatively high and a temperature at the seed crystal 11 side is relatively low. Accordingly, molten GaAs-based compound semiconductor source material 13 is sequentially solidified from the seed crystal 11 side, thereby growing the GaAs-based compound semiconductor crystal.

During the melting of GaAs-based compound semiconductor source material 13 and the growth of the GaAs-based compound semiconductor crystal, carbon oxide gas, such as CO (carbon monoxide) and/or $CO_2$ (carbon dioxide), is generated from heated upper solid carbon 15 and lower solid carbon 17, passes through a gap between sealed container 21 and crucible 22 and passes through gas-permeable crucible cover 22p, and are incorporated into molten GaAs-based compound semiconductor source material 13, with the result that carbon is supplied to an interface between the melt of GaAs-based compound semiconductor source material 13 and the GaAs-based compound semiconductor crystal.

Figure 2:
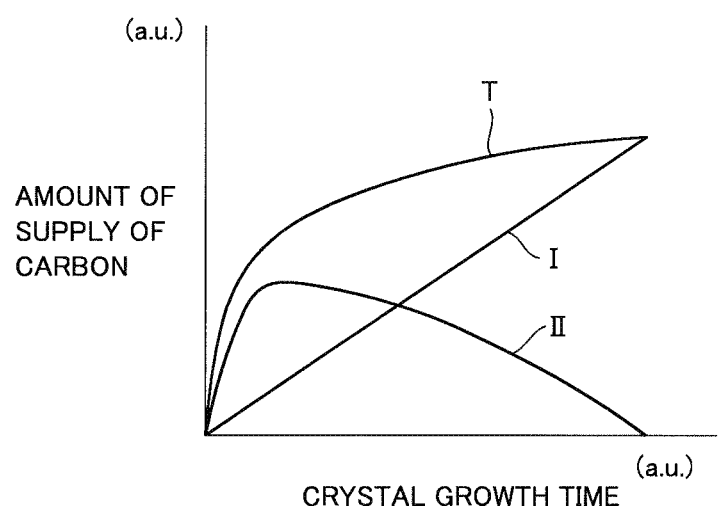
FIG. 2 is a graph showing a relation between a crystal growth time and an amount of supply of carbon when manufacturing the gallium-arsenide-based compound semiconductor crystal according to the present embodiment.

Since the temperature of atmosphere around upper solid carbon 15 is high during each of the melting of GaAs-based compound semiconductor source material 13 and the growth of the GaAs-based compound semiconductor crystal, an amount of supply of carbon from upper solid carbon 15 to the interface between the melt of GaAs-based compound semiconductor source material 13 and the GaAs-based compound semiconductor crystal is increased monotonously with passage of crystal growth time. Particularly, when the temperature of atmosphere around the upper solid carbon is substantially constant at a high temperature, the amount of supply of carbon from upper solid carbon 15 is increased substantially linearly as shown in FIG. 2 (carbon supply amount curve I). The temperature of atmosphere around lower solid carbon 17 is high during the melting of GaAs-based compound semiconductor source material 13; however, the temperature of atmosphere around lower solid carbon 17 becomes lower as the GaAs-based compound semiconductor crystal is grown. Hence, the amount of supply of carbon from lower solid carbon 17 is high at the initial stage of the crystal growth but becomes lower with passage of crystal growth time as shown in FIG. 2 (carbon supply amount curve II). Therefore, since a total amount of supply of carbon from upper solid carbon 15 and lower solid carbon 17 (total carbon supply amount curve T) is represented by a sum of the amount of supply of carbon from upper solid carbon 15 (carbon supply amount curve I) and the amount of supply of carbon from lower solid carbon 17 (carbon supply amount curve II), fluctuation in the total amount of supply of carbon becomes small in a period of time from the initial stage of the crystal growth to the end stage of the crystal growth, whereby the GaAs-based compound semiconductor crystal of the present embodiment can be grown.

Moreover, in the method for manufacturing the GaAs-based compound semiconductor crystal in the present embodiment, a boron oxide, such as $B_2O_3$, is suitably used for each sealing member. Hence, during the melting of the GaAs-based compound semiconductor source material and the growth of the GaAs-based compound semiconductor crystal, the upper solid carbon, the lower solid carbon and the carbon oxide generated therefrom react with the boron oxide and moisture, which is an impurity in the boron oxide, with the result that the carbon oxide is promoted to be generated and the boron oxide is reduced to boron, which is then incorporated into the GaAs-based compound semiconductor crystal. In the method for manufacturing the GaAs-based compound semiconductor crystal in the present embodiment, since the fluctuation in the total amount of supply of carbon during the period of time from the initial stage of the crystal growth to the end stage of the crystal growth is small, variation in boron concentration during the period of time from the initial stage of the crystal growth to the end stage of the crystal growth also becomes small.

It should be noted that regarding the addition of carbon to the GaAs-based compound semiconductor crystal, even when only upper solid carbon 15 is used, it is possible to suppress fluctuation in the amount of carbon incorporated into the GaAs-based compound semiconductor crystal if the growth rate of the GaAs-based compound semiconductor crystal (i.e., the solidification rate of the molten GaAs-based compound semiconductor source material) can be controlled. For example, by increasing the growth rate of the GaAs-based compound semiconductor crystal in accordance with an increase in the amount of supply of carbon from upper solid carbon 15, it is possible to suppress the fluctuation in the amount of carbon incorporated into the GaAs-based compound semiconductor crystal.

However, in the VB method, it is very difficult to increase the crystal growth rate of the GaAs-based compound semiconductor crystal in proportion to the increase in the amount of supply of carbon due to the following reasons. First, in the VB method, since it is difficult to observe the crystal growth rate of the GaAs-based compound semiconductor crystal, feedback cannot be provided for crystal growth condition control. Second, in the VB method, since the holder for holding the crucible is required and it is difficult that the heat conductivity of the holder coincides with the heat conductivity of the GaAs-based compound semiconductor crystal, the crystal growth rate differs between the seed crystal side of the GaAs-based compound semiconductor source material and the opposite side of the GaAs-based compound semiconductor source material. Third, generally, the EPD is facilitated to be increased as the growth rate is larger. Hence, when the growth rate is increased from the seed crystal side to the finally solidified portion for the purpose of carbon concentration control, the EPD at the finally solidified portion side is increased, thus resulting in deteriorated crystal quality.

Further, as the diameter of the GaAs-based compound semiconductor crystal is larger, it becomes more difficult to control the crystal growth rate due to the following reason. The crystal growth rate of the GaAs-based compound semiconductor crystal needs to be controlled in view of a balance among: heat input from the melt of the GaAs-based compound semiconductor source material; latent heat of solidification at the interface between the melt of the GaAs-based compound semiconductor source material and the GaAs-based compound semiconductor crystal; and heat radiation to the GaAs-based compound semiconductor crystal. Here, the latent heat of solidification becomes larger as the area of the interface between the melt of the GaAs-based compound semiconductor source material and the GaAs-based compound semiconductor crystal is larger. Hence, as the diameter of the GaAs-based compound semiconductor crystal is larger, influence of the latent heat of solidification is larger. Accordingly, it becomes difficult to keep a balance between the heat input and the heat radiation in the vicinity of the interface between the solid and liquid phases, with the result that it becomes difficult to control the crystal growth rate.

According to the method for manufacturing the GaAs-based compound semiconductor crystal in the present embodiment, since the fluctuation in the total amount of supply of carbon from the upper solid carbon and the lower solid carbon is small, the GaAs-based compound semiconductor crystal of the present embodiment in which fluctuation in specific resistance is small is obtained without controlling the crystal growth rate of the GaAs-based compound semiconductor crystal.

Second Embodiment: Wafer Group

A wafer group according to the present embodiment includes a plurality of wafers each formed from a straight body portion of a GaAs-based compound semiconductor crystal, the straight body portion having a cylindrical shape, each of the plurality of wafers having a diameter of more than or equal to 110 mm and a thickness of more than or equal to 500 µm and less than or equal to 800 µm, wherein the wafer group includes a first wafer having a lowest specific resistance and a second wafer having a highest specific resistance, and a ratio $R_2/R_1$ of a specific resistance $R_2$ in the second wafer to a specific resistance $R_1$ in the first wafer is more than or equal to 1 and less than or equal to 2. In the wafer group of the present embodiment, variation in specific resistance among the wafers is small.

Specifically, the wafer group of the present embodiment is a wafer group including a plurality of wafers cut out from the straight body portion of the GaAs-based compound semiconductor crystal of the first embodiment. For example, in the case where wafers each having a thickness of 0.8 mm are cut out from the straight body portion along a plane perpendicular to the axial direction of the straight body portion with a cutting allowance being 0.2 mm, a wafer group including 100 wafers is obtained from the straight body portion when the straight body portion has a length of 100 mm, and a wafer group including 400 wafers is obtained from the straight body portion when the straight body portion has a length of 400 mm.

(Wafer)

Although not particularly limited, the wafer is a GaAs-based compound semiconductor wafer because the wafer is formed from the straight body portion of the GaAs-based compound semiconductor crystal manufactured in the first embodiment. The GaAs-based compound semiconductor wafer refers to a compound semiconductor wafer including: Ga (gallium) as a group 13 element; and As (arsenic) as a group 15 element. Specific examples thereof include a GaAs wafer, an $Al_{1-x}Ga_xAs$ wafer (0<x<1), a $GaAs_yP_{1-y}$ wafer (0<y<1), an $In_{1-x}Ga_xAs_yP_{1-y}$ wafer (0<x<1 and 0<y<1), and the like.

(Size of Wafer)

Regarding the size of the wafer, in order to attain a large effect of decreasing the variation in specific resistance, the diameter of the wafer is more than or equal to 110 mm, is preferably more than or equal to 128 mm, and is more preferably more than or equal to 150 mm, and is preferably less than or equal to 200 mm, and is more preferably less than or equal to 154 mm. Moreover, for suitability for a substrate for various types of semiconductor devices, the thickness of the wafer is more than or equal to 500 µm and less than or equal to 800 µm, is preferably more than or equal to 510 µm and less than or equal to 780 µm, and is more preferably more than or equal to 520 µm and less than or equal to 685 µm.

(Specific Resistance of Wafer Group)

In order to attain small variation in specific resistance among the wafers in the wafer group, ratio $R_2/R_1$ of specific resistance $R_2$ in the second wafer having the highest specific resistance to specific resistance $R_1$ in the first wafer having the lowest specific resistance is more than or equal to 1 and less than or equal to 2, is preferably more than or equal to 1 and less than or equal to 1.8, and is more preferably more than or equal to 1 and less than or equal to 1.5. Here, the specific resistance is measured in accordance with the van der Pauw method using ResiTest8300 provided by TOYO Corporation.

(Carbon Concentration of Wafer Group)

In order to attain small variation in specific resistance among the wafers in the wafer group, ratio $C_2/C_1$ of carbon concentration $C_2$ in the second wafer to carbon concentration $C_1$ in the first wafer is preferably more than or equal to 1 and less than or equal to 2, is more preferably more than or equal to 1 and less than or equal to 1.5, and is further preferably more than or equal to 1 and less than or equal to 1.2. Here, the carbon concentration is measured in accordance with a FTIR (Fourier Transform Infrared Spectroscopy) method (specifically, observation of an absorption peak of local oscillation mode at 582 $cm^{-1}$).

(Boron Concentration of Wafer Group)

In order to attain small variation in specific resistance among the wafers in the wafer group, ratio $B_2/B_1$ of boron concentration $B_2$ in the second wafer to boron concentration $B_1$ in the first wafer is preferably more than or equal to 1 and less than or equal to 2, is more preferably more than or equal to 1 and less than or equal to 1.5, and is further preferably more than or equal to 1 and less than or equal to 1.3. Here, the boron concentration is measured in accordance with a GDMS (Glow Discharge Mass Spectrometry) method (VG9000 system provided by VG Elemental).

(Etching Pit Density of Wafer Group)

In order to attain small variation in crystal quality among the wafers in the wafer group, ratio $E_2/E_1$ of etching pit density $E_2$ in the second wafer to etching pit density $E_1$ in the first wafer is preferably more than or equal to 0.8 and less than or equal to 1.3, is more preferably more than or equal to 0.85 and less than or equal to 1.25, and is further preferably more than or equal to 0.9 and less than or equal to 1.2. Here, the EPD (etching pit density) refers to the number of etching pits per unit area, the etching pits being generated in a surface of the wafer when treated with a chemical. Specifically, the EPD of the wafer refers to the number of etching pits per unit area, the etching pits being generated in the surface when treated with a melt of potassium hydroxide (KOH) having a purity of more than or equal to 85 mass % at 500° C. for 20 minutes. The EPD is measured using a differential interference microscope.

(Method for Manufacturing Wafer Group)

In order to efficiently form a wafer group from a GaAs-based compound semiconductor crystal, in a method for manufacturing a wafer group in the present embodiment, the wafer group is preferably formed from the GaAs-based compound semiconductor crystal of the first embodiment. Specifically, the method for manufacturing the wafer group in the present embodiment preferably includes a cutting step of cutting a plurality of wafers out from the GaAs-based compound semiconductor crystal of the first embodiment, and more preferably includes a polishing step of polishing each of the cut-out wafers.

EXAMPLES

Examples 1 to 7

1. Manufacturing of GaAs-Based Compound Semiconductor Crystal

A crucible and an unsealed container were prepared. The crucible included a seed crystal holding portion and a crystal growth portion, had an inner diameter (inner diameter of the straight body portion at the crystal growth portion) shown in Table 1, and was composed of PBN. The unsealed container was capable of storing the crucible therein, included a seed crystal corresponding portion and a crystal growth corresponding portion, and was composed of quartz. Next, a carbon source (purity of more than or equal to 99.92 mass %) serving as a lower solid carbon and having a mass shown in Table 1 and 1 g of $B_2O_3$ were placed in the crystal growth corresponding portion of the unsealed container. Next, the crucible was placed in the unsealed container and a GaAs seed crystal having a mass shown in Table 1 was placed as a seed crystal in the seed crystal holding portion of the crucible. Next, a GaAs source material (GaAs polycrystal ingot having a purity of 99.999 mass %) having a mass shown in Table 1 was placed as a GaAs-based compound semiconductor source material in the crystal growth portion of the crucible and on the GaAs seed crystal disposed in the seed crystal holding portion of the crucible. Next, $B_2O_3$ having a mass allowing for a thickness of more than or equal to 10 mm when melted was placed as a sealing member on the GaAs source material. Next, the upper portion of the crucible was covered with a PBN member having a permeable pore and serving as a gas-permeable crucible cover. On the PBN member, a carbon source (purity of more than or equal to 99.92 mass %) having a mass shown in Table 1 was placed as an upper solid carbon. Next, the unsealed container was sealed with a cover composed of quartz and serving as a sealing cover, thereby obtaining a sealed container. Next, the sealed container was placed in the manufacturing apparatus with the sealed container being held on a holder and surrounded by a heater.

Next, heating was performed using the heater to melt the GaAs source material (GaAs-based compound semiconductor source material) and the $B_2O_3$ (sealing member). Then, in accordance with the VB method in which the sealed container is moved axially downward relative to the heater, the temperature at the GaAs single crystal side was made lower than the temperature at the GaAs source material side, thereby growing a GaAs crystal including a straight body portion having diameter and length shown in Table 1. The straight body portion was cut out from the obtained GaAs crystal, and measurement or calculation was performed to find: a specific resistance $R_{10}$ at the first end surface side of the straight body portion; a specific resistance $R_{20}$ at the second end surface side of the straight body portion; a ratio $R_{20}/R_{10}$ thereof; a carbon concentration $C_{10}$ at the first end surface side of the straight body portion; a carbon concentration $C_{20}$ at the second end surface side of the straight body portion; a ratio $C_{20}/C_{10}$ thereof; a boron concentration $B_{10}$ at the first end surface side of the straight body portion; a boron concentration $B_{20}$ at the second end surface side of the straight body portion; a ratio $B_{20}/B_{10}$ thereof; an etching pit density $E_{10}$ at the first end surface side of the straight body portion; an etching pit density $E_{20}$ at the second end surface side of the straight body portion; and a ratio $E_{20}/E_{10}$ thereof. The specific resistance was measured in accordance with the van der Pauw method using ResiTest8300 provided by TOYO Corporation. The carbon concentration was measured in accordance with a FTIR (Fourier Transform Infrared Spectroscopy) method (specifically, observation of an absorption peak of local oscillation mode at 582 $cm^{-1}$). The boron concentration was measured in accordance with a GDMS (Glow Discharge Mass Spectrometry) method (VG9000 system provided by VG Elemental). The EPD (etching pit density) was measured by measuring, using a differential interference microscope, the number of etching pits per unit area, the etching pits being generated in the surface when treated with a melt of potassium hydroxide (KOH) having a purity of more than or equal to 85 mass % at 500° C. for 20 minutes. Results thereof are collectively shown in Table 1.

2. Manufacturing of Wafer Group

The outer peripheral portion of the straight body portion of the above-described GaAs crystal was ground and wafers each having a thickness of 0.8 mm (800 µm) were then cut out from the straight body portion in a direction perpendicular to the axial direction of the straight body portion with a cutting allowance being 0.2 mm. Both the main surfaces of each of the wafers thus cut out were polished, thereby producing a wafer group including the number of wafers as shown in Table 2, each of the wafers having a thickness of 750 µm. The specific resistance of each of the wafers of the obtained wafer group was measured. For a first wafer having the lowest specific resistance and a second wafer having the highest specific resistance, measurement or calculation was performed to find: a specific resistance $R_1$ in the first wafer; a specific resistance $R_2$ in the second wafer; a ratio $R_2/R_1$ thereof; a carbon concentration $C_1$ in the first wafer; a carbon concentration $C_2$ in the second wafer; a ratio $C_2/C_1$ thereof; a boron concentration $B_1$ in the first wafer; a boron concentration $B_2$ in the second wafer; a ratio $B_2/B_1$ thereof, an etching pit density $E_1$ in the first wafer; an etching pit density $E_2$ in the second wafer; and a ratio $E_2/E_1$ thereof. The specific resistance, carbon concentration, boron concentration, and EPD (etching pit density) were measured in the same manner as those in the case of the GaAs crystal.

Comparative Example 1

A GaAs crystal, which is a GaAs-based compound semiconductor crystal, and a wafer group obtained therefrom were produced in the same manner as in Example 3 except that no lower solid carbon was placed. Moreover, for the GaAs crystal, measurement or calculation was performed in the same manner as in Example 3 so as to find: a specific resistance $R_{10}$ at the first end surface side of the straight body portion; a specific resistance $R_{20}$ at the second end surface side of the straight body portion; a ratio $R_{20}/R_{10}$ thereof; a carbon concentration $C_{10}$ at the first end surface side of the straight body portion; a carbon concentration $C_{20}$ at the second end surface side of the straight body portion; a ratio $C_{20}/C_{10}$ thereof; a boron concentration $B_{10}$ at the first end surface side of the straight body portion; a boron concentration $B_{20}$ at the second end surface side of the straight body portion; a ratio $B_{20}/B_{10}$ thereof an etching pit density $E_{10}$ at the first end surface side of the straight body portion; an etching pit density $E_{20}$ at the second end surface side of the straight body portion; and a ratio $E_{20}/E_{10}$ thereof. Moreover, the specific resistance of each of the wafers of the wafer group was measured. For a first wafer having the lowest specific resistance and a second wafer having the highest specific resistance, measurement or calculation was performed in the same manner as in Example 3 so as to find: a specific resistance $R_1$ in the first wafer; a specific resistance $R_2$ in the second wafer; a ratio $R_2/R_1$ thereof, a carbon concentration $C_1$ in the first wafer; a carbon concentration $C_2$ in the second wafer; a ratio $C_2/C_1$ thereof; a boron concentration $B_1$ in the first wafer; a boron concentration $B_2$ in the second wafer; a ratio $B_2/B_1$ thereof; an etching pit density $E_1$ in the first wafer; an etching pit density $E_2$ in the second wafer; and a ratio $E_2/E_1$ thereof. Results thereof are collectively shown in Table 1 and Table 2.

Comparative Example 2

A GaAs crystal, which is a GaAs-based compound semiconductor crystal, and a wafer group obtained therefrom were produced in the same manner as in Example 3 except that no upper solid carbon was placed. Moreover, for the GaAs crystal, measurement or calculation was performed in the same manner as in Example 3 so as to find: a specific resistance $R_{10}$ at the first end surface side of the straight body portion; a specific resistance $R_{20}$ at the second end surface side of the straight body portion; a ratio $R_{20}/R_{10}$ thereof; a carbon concentration $C_{10}$ at the first end surface side of the straight body portion; a carbon concentration $C_{20}$ at the second end surface side of the straight body portion; a ratio $C_{20}/C_{10}$ thereof; a boron concentration $B_{10}$ at the first end surface side of the straight body portion; a boron concentration $B_{20}$ at the second end surface side of the straight body portion; a ratio $B_{20}/B_{10}$ thereof, an etching pit density $E_{10}$ at the first end surface side of the straight body portion; an etching pit density $E_{20}$ at the second end surface side of the straight body portion; and a ratio $E_{20}/E_{10}$ thereof.

Moreover, the specific resistance of each of the wafers of the wafer group was measured. For a first wafer having the lowest specific resistance and a second wafer having the highest specific resistance, measurement or calculation was performed in the same manner as in Example 3 so as to find: a specific resistance $R_1$ in the first wafer; a specific resistance $R_2$ in the second wafer; a ratio $R_2/R_1$ thereof, a carbon concentration $C_1$ in the first wafer; a carbon concentration $C_2$ in the second wafer; a ratio $C_2/C_1$ thereof; a boron concentration $B_1$ in the first wafer; a boron concentration $B_2$ in the second wafer; a ratio $B_2/B_1$ thereof; an etching pit density $E_1$ in the first wafer; an etching pit density $E_2$ in the second wafer; and a ratio $E_2/E_1$ thereof. Results thereof are collectively shown in Table 1 and Table 2.

TABLE 1

| | | Example 1 | Example 2 | Example 3 | Example 4 | Example 5 | Example 6 | Example 7 | Comparative Example 1 | Comparative Example 2 |
|---|---|---|---|---|---|---|---|---|---|---|
| Compound Semiconductor Crystal | Manufacturing Method | VB | VB | VB | VB | VB | VB | VB | VB | VB |
| | Inner Diameter of Straight Body Portion of Crucible (mm) | 154 | 154 | 154 | 154 | 130 | 113 | 204 | 154 | 154 |
| | Upper Solid Carbon (g) | 0.2 | 0.2 | 0.2 | 0.2 | 0.15 | 0.1 | 0.3 | 0.2 | — |
| | GaAs Source Material (g) | 12300 | 26900 | 31700 | 36500 | 26700 | 20000 | 20000 | 31700 | 31700 |
| | GaAs Seed Crystal (g) | 25 | 25 | 25 | 25 | 25 | 25 | 25 | 25 | 25 |
| | Lower Solid Carbon (g) | 0.2 | 0.2 | 0.2 | 0.2 | 0.15 | 0.1 | 0.3 | — | 0.2 |
| | Diameter of Straight Body Portion of Crystal (mm) | 153 | 153 | 153 | 153 | 129 | 112 | 203.8 | 153 | 153 |
| | Length of Straight Body Portion of Crystal (mm) | 100 | 250 | 350 | 400 | 350 | 400 | 100 | 350 | 350 |
| | Specific Resistance $R_{10}$ at First End Surface Side ($\Omega \cdot$ cm) | $9.8 \times 10^7$ | $1.2 \times 10^8$ | $1.3 \times 10^8$ | $1.4 \times 10^8$ | $1.3 \times 10^8$ | $1.0 \times 10^8$ | $9.7 \times 10^7$ | $1.0 \times 10^8$ | $1.1 \times 10^8$ |
| | Specific Resistance $R_{20}$ at Second End Surface Side ($\Omega \cdot$ cm) | $1.8 \times 10^8$ | $1.8 \times 10^8$ | $2.4 \times 10^8$ | $2.8 \times 10^8$ | $2.4 \times 10^8$ | $1.8 \times 10^8$ | $1.6 \times 10^8$ | $3.5 \times 10^8$ | $4.5 \times 10^8$ |
| | Ratio $R_{20}/R_{10}$ | 1.8 | 1.5 | 1.8 | 2.0 | 1.8 | 1.8 | 1.6 | 3.5 | 4.1 |
| | Carbon Concentration $C_{10}$ at First End Surface Side (Atoms/cm³) | $4.5 \times 10^{15}$ | $5.1 \times 10^{15}$ | $5.4 \times 10^{15}$ | $5.6 \times 10^{15}$ | $5.4 \times 10^{15}$ | $4.5 \times 10^{15}$ | $4.5 \times 10^{15}$ | $4.5 \times 10^{15}$ | $4.8 \times 10^{15}$ |
| | Carbon Concentration $C_{20}$ at Second End Surface Side (Atoms/cm³) | $6.6 \times 10^{15}$ | $6.6 \times 10^{15}$ | $7.9 \times 10^{15}$ | $8.7 \times 10^{15}$ | $7.9 \times 10^{15}$ | $6.6 \times 10^{15}$ | $6.1 \times 10^{15}$ | $1.0 \times 10^{16}$ | $1.2 \times 10^{16}$ |
| | Ratio $C_{20}/C_{10}$ | 1.5 | 1.3 | 1.5 | 1.5 | 1.5 | 1.4 | 1.4 | 2.2 | 2.4 |
| | Boron Concentration $B_{10}$ at First End Surface (Atoms/cm³) | $5.0 \times 10^{16}$ | $5.5 \times 10^{16}$ | $5.8 \times 10^{16}$ | $6.0 \times 10^{16}$ | $5.8 \times 10^{16}$ | $5.0 \times 10^{16}$ | $5.0 \times 10^{16}$ | $5.0 \times 10^{16}$ | $5.3 \times 10^{16}$ |
| | Boron Concentration $B_{20}$ at Second End Surface (Atoms/cm³) | $6.8 \times 10^{16}$ | $6.8 \times 10^{16}$ | $7.9 \times 10^{16}$ | $8.6 \times 10^{16}$ | $7.9 \times 10^{16}$ | $6.8 \times 10^{16}$ | $6.4 \times 10^{16}$ | $9.6 \times 10^{16}$ | $1.1 \times 10^{17}$ |
| | Ratio $B_{20}/B_{10}$ | 1.4 | 1.2 | 1.4 | 1.4 | 1.4 | 1.4 | 1.3 | 1.9 | 2.1 |
| | Etching Pit Density $E_{10}$ at First End Surface Side (/cm²) | 4460 | 5890 | 6390 | 7410 | 6110 | 4470 | 6500 | 7090 | 5470 |
| | Etching Pit Density $E_{20}$ at Second End Surface Side (/cm²) | 5050 | 5930 | 6550 | 7510 | 6810 | 4600 | 7000 | 5310 | 7470 |
| | Ratio $E_{20}/E_{10}$ | 1.12 | 1.01 | 1.03 | 1.01 | 1.11 | 1.03 | 1.08 | 0.75 | 1.37 |

TABLE 2

| | | Example 1 | Example 2 | Example 3 | Example 4 | Example 5 | Example 6 | Example 7 | Comparative Example 1 | Comparative Example 2 |
|---|---|---|---|---|---|---|---|---|---|---|
| Wafer Group | Wafer Diameter (mm) | 150 | 150 | 150 | 150 | 128 | 110 | 200 | 150 | 150 |
| | Wafer Thickness (μm) | 760 | 760 | 760 | 760 | 760 | 760 | 760 | 760 | 760 |
| | Number of Wafers | 100 | 250 | 350 | 400 | 350 | 400 | 100 | 350 | 350 |
| | Specific Resistance $R_1$ of First Wafer ($\Omega \cdot cm$) | $9.8 \times 10^7$ | $1.2 \times 10^8$ | $1.3 \times 10^8$ | $1.4 \times 10^8$ | $1.3 \times 10^8$ | $1.0 \times 10^8$ | $9.7 \times 10^7$ | $1.0 \times 10^8$ | $1.1 \times 10^8$ |
| | Specific Resistance $R_2$ of Second Wafer ($\Omega \cdot cm$) | $1.8 \times 10^8$ | $1.8 \times 10^8$ | $2.4 \times 10^8$ | $2.8 \times 10^8$ | $2.4 \times 10^8$ | $1.8 \times 10^8$ | $1.6 \times 10^8$ | $3.5 \times 10^8$ | $4.5 \times 10^8$ |
| | Ratio $R_2/R_1$ | 1.8 | 1.5 | 1.8 | 2.0 | 1.8 | 1.8 | 1.6 | 3.5 | 4.1 |
| | Carbon Concentration $C_1$ of First Wafer (Atoms/cm$^3$) | $4.5 \times 10^{15}$ | $5.1 \times 10^{15}$ | $5.4 \times 10^{15}$ | $5.6 \times 10^{15}$ | $5.4 \times 10^{15}$ | $4.5 \times 10^{15}$ | $4.5 \times 10^{15}$ | $4.5 \times 10^{15}$ | $4.8 \times 10^{15}$ |
| | Carbon Concentration $C_2$ of Second Wafer (Atoms/cm$^3$) | $6.6 \times 10^{15}$ | $6.6 \times 10^{15}$ | $7.9 \times 10^{15}$ | $8.7 \times 10^{15}$ | $7.9 \times 10^{15}$ | $6.6 \times 10^{15}$ | $6.1 \times 10^{15}$ | $1.0 \times 10^{16}$ | $1.2 \times 10^{16}$ |
| | Ratio $C_2/C_1$ | 1.5 | 1.3 | 1.5 | 1.5 | 1.5 | 1.4 | 1.4 | 2.2 | 2.4 |
| | Boron Concentration $B_1$ of First Wafer (Atoms/cm$^3$) | $5.0 \times 10^{16}$ | $5.5 \times 10^{16}$ | $5.8 \times 10^{16}$ | $6.0 \times 10^{16}$ | $5.8 \times 10^{16}$ | $5.0 \times 10^{16}$ | $5.0 \times 10^{16}$ | $5.0 \times 10^{16}$ | $5.3 \times 10^{16}$ |
| | Boron Concentration $B_2$ of Second Wafer (Atoms/cm$^3$) | $6.8 \times 10^{16}$ | $6.8 \times 10^{16}$ | $7.9 \times 10^{16}$ | $8.6 \times 10^{16}$ | $7.9 \times 10^{16}$ | $6.8 \times 10^{16}$ | $6.4 \times 10^{16}$ | $9.6 \times 10^{16}$ | $1.1 \times 10^{17}$ |
| | Ratio $B_2/B_1$ | 1.4 | 1.2 | 1.4 | 1.4 | 1.4 | 1.4 | 1.3 | 1.9 | 2.1 |
| | Etching Pit Density $E_{10}$ of First Wafer (/cm$^2$) | 4460 | 5890 | 6390 | 7410 | 6110 | 4470 | 6500 | 7090 | 5470 |
| | Etching Pit Density $E_{20}$ of Second Wafer (/cm$^2$) | 5050 | 5930 | 6550 | 7510 | 6810 | 4600 | 7000 | 5310 | 7470 |
| | Ratio $E_2/E_1$ | 1.12 | 1.01 | 1.03 | 1.01 | 1.11 | 1.03 | 1.08 | 0.75 | 1.37 |

With reference to Table 1, in each of the GaAs crystals of Example 1 to Example 7 each of which was grown by the VB method with the upper solid carbon and the lower solid carbon being disposed in the sealed container and each of which had the straight body portion having a diameter of more than or equal to 100 mm and a length of more than or equal to 100 mm and less than or equal to 400 mm, ratio $R_{20}/R_{10}$ of specific resistance $R_{20}$ at the second end surface side to specific resistance $R_{10}$ at the first end surface side was more than or equal to 1 and less than or equal to 2, thus resulting in small variation in specific resistance. On the other hand, in the GaAs crystal of Comparative Example 1 which was grown by the VB method with only the upper solid carbon being disposed in the sealed container and which had the straight body portion having a diameter of 152.4 mm (6 inches) and a length of 300 mm, ratio $R_{20}/R_{10}$ of specific resistance $R_{20}$ at the second end surface side to specific resistance $R_{10}$ at the first end surface side was more than 2, thus resulting in large variation in specific resistance. Moreover, in the GaAs crystal of Comparative Example 2 which was grown by the VB method with only the lower solid carbon being disposed in the sealed container and which had the straight body portion having a diameter of 152.4 mm (6 inches) and a length of 300 mm, ratio $R_{20}/R_{10}$ of specific resistance $R_{20}$ at the second end surface side to specific resistance $R_{10}$ at the first end surface side was more than 2, thus resulting in large variation in specific resistance.

With reference to Table 2, in each of the wafer groups of Example 1 to Example 7 formed from the straight body portions of the GaAs crystals each of which was grown by the VB method with the upper solid carbon and the lower solid carbon being disposed in the sealed container and each of which had the straight body portion having a diameter of more than or equal to 100 mm and a length of more than or equal to 100 mm and less than or equal to 400 mm, ratio $R_2/R_1$ of specific resistance $R_2$ in the second wafer having the highest specific resistance to specific resistance $R_1$ in the first wafer having the lowest specific resistance was more than or equal to 1 and less than or equal to 2, thus resulting in small variation in specific resistance. On the other hand, in the wafer group of Comparative Example 1 formed from the straight body portion of the GaAs crystal which was grown by the VB method with only the upper solid carbon being disposed in the sealed container and which had the straight body portion having a diameter of 152.4 mm (6 inches) and a length of 300 mm, ratio $R_2/R_1$ of specific resistance $R_2$ in the second wafer having the highest specific resistance to specific resistance $R_1$ in the first wafer having the lowest specific resistance was more than 2, thus resulting in large variation in specific resistance. Moreover, in the wafer group of Comparative Example 2 formed from the straight body portion of the GaAs crystal which was grown by the VB method with only the lower solid carbon being disposed in the sealed container and which had the straight body portion having a diameter of 152.4 mm (6 inches) and a length of 300 mm, ratio $R_2/R_1$ of specific resistance $R_2$ in the second wafer having the highest specific resistance to specific resistance $R_1$ in the first wafer having the lowest specific resistance was more than 2, thus resulting in large variation in specific resistance.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims and the examples.

REFERENCE SIGNS LIST

11: seed crystal; 13: GaAs-based compound semiconductor source material; 15: upper solid carbon; 17: lower solid carbon; 20: manufacturing apparatus; 21: sealed container; 21o: unsealed container; 21p: sealing cover; 22: crucible; 22p: gas-permeable crucible cover; 23, 24: sealing member; 25: holder; 26: heater; I: carbon supply amount curve indicating an amount of supply of carbon from the upper solid carbon; II: carbon supply amount curve indicating an amount of supply of carbon from the lower solid carbon; T: total carbon supply amount curve indicating a total amount of supply of carbon from the upper solid carbon and the lower solid carbon.

The invention claimed is:

1. A gallium-arsenide-based compound semiconductor crystal comprising a straight body portion having a cylindrical shape, wherein
the straight body portion has a diameter of more than or equal to 110 mm and has a length of more than or equal to 350 mm and less than or equal to 400 mm, and
the straight body portion has a first end surface and a second end surface, a specific resistance $R_{10}$ at the first end surface side is more than or equal to $1.0 \times 10^8$ Ω·cm and less than or equal to $1.4 \times 10^8$ Ω·cm, a specific resistance $R_{20}$ at the second end surface side is more than or equal to $1.8 \times 10^8$ Ω·cm and less than or equal to $2.8 \times 10^8$ Ω·cm, and a ratio $R_{20}/R_{10}$ of the specific resistance $R_{20}$ to the specific resistance $R_{10}$ is less than or equal to 2, and wherein
a carbon concentration $C_{10}$ at the first end surface side is more than or equal to $4.5 \times 10^{15}$ atoms/cm$^3$ and less than or equal to $5.6 \times 10^{15}$ atoms/cm$^3$, a carbon concentration $C_{20}$ at the second end surface side is more than or equal to $6.6 \times 10^{15}$ atoms/cm$^3$ and less than or equal to $8.7 \times 10^{15}$ atoms/cm$^3$, and wherein
a boron concentration $B_{10}$ at the first end surface side is more than or equal to $5.0 \times 10^{16}$ atoms/cm$^3$ and less than or equal to $6.0 \times 10^{16}$ atoms/cm$^3$, a boron concentration $B_{20}$ at the second end surface side is more than or equal to $6.8 \times 10^{16}$ atoms/cm$^3$ and less than or equal to $8.6 \times 10^{16}$ atoms/cm$^3$.

2. The gallium-arsenide-based compound semiconductor crystal according to claim 1, wherein a ratio $E_{20}/E_{10}$ of an etching pit density $E_{20}$ at the second end surface side to an etching pit density $E_{10}$ at the first end surface side is more than or equal to 0.8 and less than or equal to 1.2.

3. A wafer group comprising a plurality of wafers each formed from a straight body portion of a gallium-arsenide-based compound semiconductor crystal, the straight body portion having a cylindrical shape, the straight body portion having a diameter of more than or equal to 110 mm and having a length of more than or equal to 350 mm and less than or equal to 400 mm, each of the plurality of wafers having a diameter of more than or equal to 110 mm and a thickness of more than or equal to 500 μm and less than or equal to 800 μm, wherein
the wafer group includes a first wafer and a second wafer, a specific resistance $R_1$ in the first wafer is more than or equal to $1.0 \times 10^8$ Ω·cm and less than or equal to $1.4 \times 10^8$ Ω·cm, a specific resistance $R_2$ in the second wafer is more than or equal to $1.8 \times 10^8$ Ω·cm and less than or equal to $2.8 \times 10^8$ Ω·cm, and a ratio $R_2/R_1$ of the specific resistance $R_2$ to the specific resistance $R_1$ is less than or equal to 2, and wherein
a carbon concentration $C_1$ in the first wafer is more than or equal to $4.5 \times 10^{15}$ atoms/cm$^3$ and less than or equal to $5.6 \times 10^{15}$ atom/cm$^3$, a carbon concentration $C_2$ in the second wafer is more than or equal to $6.6 \times 10^{15}$ atoms/cm$^3$ and less than or equal to $8.7 \times 10^{15}$ atoms/cm$^3$, and wherein
a boron concentration $B_1$ in the first wafer is more than or equal to $5.0 \times 10^{16}$ atoms/cm$^3$ and less than or equal to $6.0 \times 10^{16}$ atoms/cm$^3$, a boron concentration $B_2$ in the second wafer is more than or equal to $6.8 \times 10^{16}$ atoms/cm$^3$ and less than or equal to $8.6 \times 10^{16}$ atoms/cm$^3$.

4. The wafer group according to claim 3, wherein a ratio $E_2/E_1$ of an etching pit density $E_2$ in the second wafer to an etching pit density $E_1$ in the first wafer is more than or equal to 0.8 and less than or equal to 1.2.

5. The gallium-arsenide-based compound semiconductor crystal according to claim 2, wherein the etching pit density $E_{10}$ is more than or equal to 4470/cm$^2$ and less than or equal to 7410/cm$^2$, and the etching pit density $E_{20}$ is more than or equal to 4600/cm$^2$ and less than or equal to 7510/cm$^2$.

6. The gallium-arsenide-based compound semiconductor crystal according to claim 1, wherein a ratio $C_{20}/C_{10}$ is less than or equal to 1.5.

7. The wafer group according to claim 4, wherein the etching pit density $E_1$ is more than or equal to 4470/cm$^2$ and less than or equal to 7410/cm$^2$, and the etching pit density $E_2$ is more than or equal to 4600/cm$^2$ and less than or equal to 7510/cm$^2$.

8. The wafer group according to claim 1, wherein a ratio $C_2/C_1$ is less than or equal to 1.5.

* * * * *